United States Patent
Bastani et al.

(10) Patent No.: US 11,320,743 B2
(45) Date of Patent: May 3, 2022

(54) METHOD TO LABEL SUBSTRATES BASED ON PROCESS PARAMETERS

(71) Applicant: ASML NETHERLANDS B.V., Veldhoven (NL)

(72) Inventors: Vahid Bastani, Eindhoven (NL); Alexander Ypma, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/044,771

(22) PCT Filed: Mar. 4, 2019

(86) PCT No.: PCT/EP2019/055262
§ 371 (c)(1),
(2) Date: Oct. 1, 2020

(87) PCT Pub. No.: WO2019/206498
PCT Pub. Date: Oct. 31, 2019

(65) Prior Publication Data
US 2021/0116818 A1 Apr. 22, 2021

Related U.S. Application Data

(60) Provisional application No. 62/663,866, filed on Apr. 27, 2018.

(30) Foreign Application Priority Data

Jul. 10, 2018 (EP) ..................................... 18182594

(51) Int. Cl.
*G03F 7/20* (2006.01)

(52) U.S. Cl.
CPC ...... *G03F 7/70508* (2013.01); *G03F 7/70525* (2013.01)

(58) Field of Classification Search
CPC ............. G03F 7/70508; G03F 7/70525; G03F 7/70616; G03F 7/70491; G03F 7/70633;
(Continued)

(56) References Cited

U.S. PATENT DOCUMENTS

| 6,952,253 B2 | 10/2005 | Lof et al. |
| 2003/0029912 A1 | 2/2003 | Li et al. |

(Continued)

FOREIGN PATENT DOCUMENTS

| CN | 104865799 | 8/2015 |
| DE | 102012207335 | 3/2013 |

(Continued)

OTHER PUBLICATIONS

International Search Report and Written Opinion issued in corresponding PCT Patent Application No. PCT/EP2019/055, dated Apr. 18, 2019.

(Continued)

*Primary Examiner* — Mesfin T Asfaw
(74) *Attorney, Agent, or Firm* — Pillsbury Winthrop Shaw Pittman LLP

(57) ABSTRACT

A method of grouping data associated with substrates undergoing a process step of a manufacturing process is disclosed. The method includes obtaining first data associated with substrates before being subject to the process step and obtaining a plurality of sets of second data associated with substrates after being subject to the process step, each set of second data being associated with a different value of a characteristic of the first data. A distance metric is determined which describes a measure of distance between the sets of second data, and the second data is grouped based on a property of the distance metric.

20 Claims, 7 Drawing Sheets

(58) Field of Classification Search
CPC ... G03F 7/705; G05B 19/41875; Y02P 90/02; H01L 22/20; H01L 22/12; G06F 16/2365; G06F 16/9024; G06F 16/285; G06F 16/35; G06F 16/248; G06F 16/215; G06F 17/18; G06Q 30/02; G06N 20/00
See application file for complete search history.

(56) References Cited

U.S. PATENT DOCUMENTS

2017/0336716 A1  11/2017  Flagello et al.
2019/0317412 A1  10/2019  Mos et al.

FOREIGN PATENT DOCUMENTS

| | | |
|---|---|---|
| TW | 201802614 | 1/2018 |
| WO | 2017060080 | 4/2017 |
| WO | 2017067748 | 4/2017 |
| WO | 2017144343 | 8/2017 |
| WO | 2018072980 | 4/2018 |

OTHER PUBLICATIONS

Lee et al.: "Reduction of in-lot overlay variation with integrated metrology, and a holistic control strategy", Proc. of SPIE, vol. 9635, Oct. 23, 2015.

METHOD TO LABEL SUBSTRATES BASED ON PROCESS PARAMETERS

CROSS-REFERENCE TO RELATED APPLICATIONS

This application is the U.S. national phase entry of PCT Patent Application No. PCT/EP2019/055262, which was filed on Mar. 4, 2019, which claims the benefit of priority of U.S. patent application No. 62/663,866 which was filed on Apr. 27, 2018 and of European patent application No. 18182594.4 which was filed on Jul. 10, 2018 and which are incorporated herein in their entireties by reference.

FIELD

The present disclosure relates to processing of substrates for the production of, for example, semiconductor devices.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use radiation. The wavelength of this radiation determines the minimum size of features which can be formed on the substrate. Typical wavelengths currently in use are about 365 nm (i-line), about 248 nm, about 193 nm and about 13 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of about 193 nm.

Low-k1 lithography may be used to process features with dimensions smaller than the classical resolution limit of a lithographic apparatus. In such a process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of a numerical aperture (NA) a customized illumination scheme, use of one or more phase shifting patterning devices, optimization of the design layout such as optical proximity correction (OPC) in the design layout, or other methods generally defined as resolution enhancement techniques (RET). Additionally or alternatively, one or more tight control loops for controlling a stability of the lithographic apparatus may be used to improve reproduction of the pattern at low k1.

SUMMARY

Effectiveness of the control of a lithographic apparatus may depend on characteristics of individual substrates. For example, a first substrate processed by a first processing tool prior to processing by the lithographic apparatus (or any other process step of the manufacturing process, herein referred to generically as a manufacturing process step) may benefit from (slightly) different control parameters than a second substrate processed by a second processing tool prior to processing by the lithographic apparatus.

Typically for substrates, pre-processing data is available (data associated with manufacturing process steps performed before a certain manufacturing process step of interest) and post-processing data (data associated with measurements performed on substrates after having been subject to the manufacturing process step of interest). It is desirable, for example, to control the manufacturing process of interest based on knowledge of the pre-processing data, as this allows the control loop to anticipate an expected post-processing result. However, this control typically involves knowledge of the relation between pre-processing information and post-processing information and how control parameters of the process of interest affect the post-processing data. It may not always be known how control settings of the process of interest affect post-processing data. For example, an applied dose setting within a lithographic process may have a predictable effect on a certain critical dimension associated with a feature obtained after performing the lithographic process, or it may not. More problematic can be poor performance of methods to predict post-processing data based on, often very large amounts of, pre-processing data. Often the pre-processing data comprises too many parameters to allow the construction of a reliable model linking pre-processing data to post-processing data.

Machine learning techniques may be utilized to recognize patterns of cause-and-effect between processing context observed impact on one or more characteristics (such as overlay, CD, edge placement error (EPE), etc.) of substrates being subject to a process. These patterns can then be used to predict and correct errors in processing subsequent substrates. Some examples of such systems are described in PCT patent application publication no. WO 2017/060080. In a few cases the pre-processing data has a limited set of associated parameters. For example, when only an identification (ID) of an etch chamber is used as the pre-processing data associated with to-be-processed substrates, it may be straightforward to establish a relation between a certain cluster of post-processing data and a value of the parameter comprised within the pre-processing data. In more general cases, however, many pre-processing parameters and potential values associated with these parameters can be registered for many processing tools and may potentially be used for context based control purposes. It becomes unclear how to cluster post-processing data and subsequently assign these clusters to a certain parameter (value) sub-space comprised within the pre-processing (e.g. context) data. The amount of possible configurations of partitioning the pre-processing data into smaller sets (subsets) is simply too large.

It is proposed to create a reliable method for partitioning context data by analysis of object data associated with the context data. The object data is grouped based on commonality of parameter (values) comprised within the context data. The object data is processed per group to obtain a set of representative object data sets, each set associated with a common value of a parameter comprised within the context data. The processing may be, for example, an averaging operation yielding a set of average object data fingerprints (per context parameter). The processed object data sets may further be analyzed, for example in a spectral domain of an adjacency matrix associated with the sets of processed object data, to convey a structure associated with the context data. This structure may then be used to divide the context data into groups (e.g. partition the context data, label the context data, provide codes to the context data, etc.).

In an aspect, there is provided a method for grouping data associated with substrates undergoing a process step of a manufacturing process, the method comprising: obtaining first data associated with substrates before being subject to the process step; obtaining a plurality of sets of second data associated with substrates after being subject to the process step, each set of second data being associated with a different value of a characteristic of the first data; determining a distance metric describing a measure of distance between the sets of second data; and grouping the second data based on a property of the distance metric.

In an embodiment a method of grouping data is disclosed, the method comprising: obtaining context data associated with a manufacturing process; obtaining object data associated with the context data; and utilizing a method of spectral clustering to group the context data into clusters based on the object data and the context data.

In a further aspect of the invention, there is provided a computer program comprising program instructions operable to perform the method of the first aspect when run on a suitable apparatus.

BRIEF DESCRIPTION OF THE DRAWINGS

Embodiments of the invention will now be described, by way of example only, with reference to the accompanying schematic drawings, in which.

DETAILED DESCRIPTION

Figure 1:
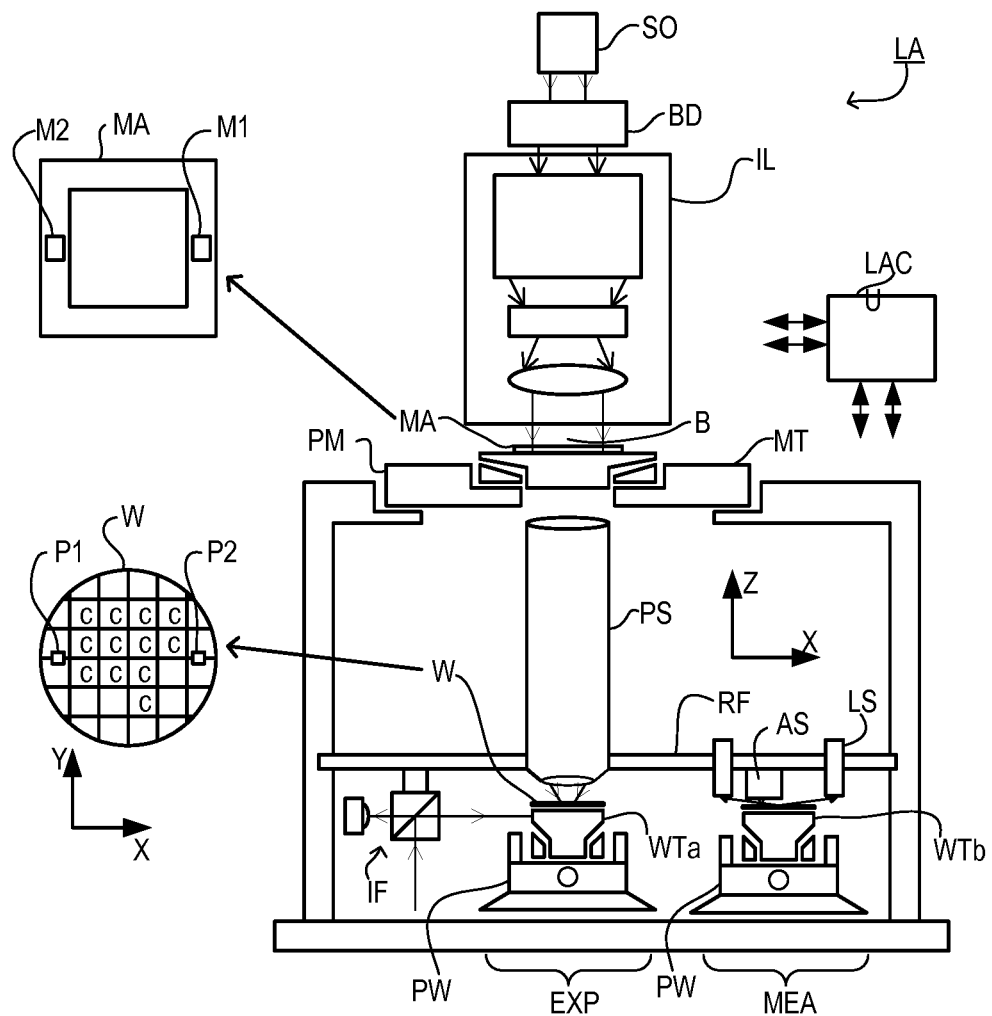
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support (e.g., a mask table) T constructed to support a patterning device (e.g., a mask) MA and connected to a first positioner PM configured to accurately position the patterning device MA in accordance with certain parameters, one or more substrate supports (e.g., a wafer table) WTa and WTb constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

Lithographic apparatus LA in this example is of a so-called dual stage type which has two substrate tables WTa and WTb and two stations—an exposure station and a measurement station-between which the substrate tables can be moved. While one substrate on one substrate table is being exposed at the exposure station EXP, another substrate can be loaded onto the other substrate table at, e.g., the measurement station MEA or at another location (not shown) or can be processed at measurement station MEA. A substrate table with a substrate can be located at measurement station MEA so that various preparatory steps may be carried out. The preparatory steps may include mapping the surface height of the substrate using a level sensor LS and/or measuring the position of alignment marks on the substrate using an alignment sensor AS. The alignment marks are arranged nominally in a regular grid pattern. However, due to inaccuracies in creating the marks and also due to deformations of the substrate that occur throughout its processing, the marks may deviate from the ideal grid. Consequently, in addition to measuring position and orientation of the substrate, the alignment sensor in practice may measure in detail the positions of many marks across the substrate area, if the apparatus LA is to print product features at the correct locations with high accuracy. The measurement of alignment marks can therefore be time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. An embodiment of the invention can be applied in an apparatus with only one substrate table, or with more than two.

In addition to having one or more substrate supports, the lithographic apparatus LA may comprise a measurement stage (not shown). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The apparatus further includes a lithographic apparatus control unit LACU which controls all the movements and measurements of various actuators and sensors of the lithographic apparatus (such as those described). Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
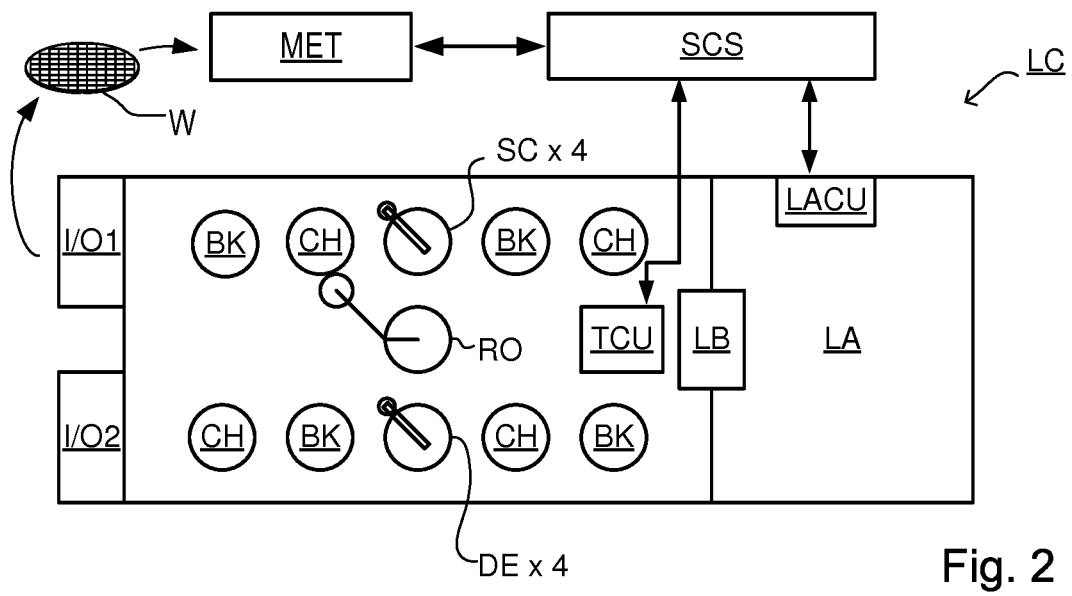
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatuses to perform pre- and post-exposure processes on a substrate W. Conventionally these apparatuses includes one or more spin coaters SC to deposit resist layers, one or more developers DE to develop exposed resist, one or more chill plates CH and one or more bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatuses and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, one or more inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus MET, which may also be referred to as a metrology apparatus or metrology tool, is used to determine one or more properties of the substrates W, and in particular, how one or more properties of different substrates W vary or how one or more properties associated with different layers of the same substrate W vary from layer to layer. The inspection apparatus may be constructed to identify defects on the substrate W and may, for example, be part of the lithocell LC, or may be integrated into the lithographic apparatus LA, or may even be a stand-alone device. The inspection apparatus may measure the one or more properties on a latent image (an image in a resist layer after the exposure), or on a semi-latent image (an image in a resist layer after a post-exposure bake step), or on a developed resist image (in which the exposed or unexposed parts of the resist have been removed), or even on an etched image (after a pattern transfer step such as etching).

Figure 3:
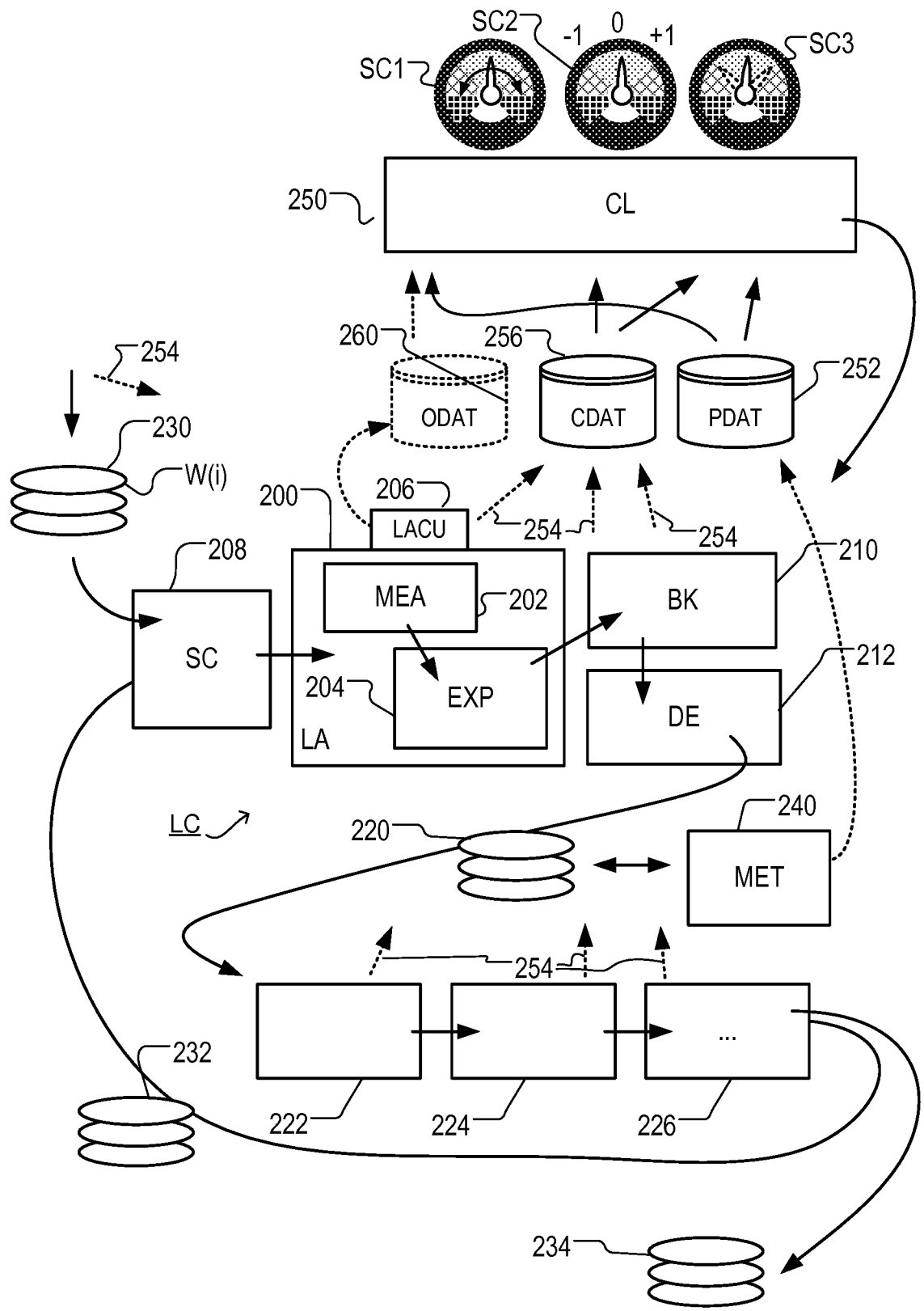
FIG. 3 shows schematically the use of the lithographic apparatus and lithographic cell of FIGS. 1 and 2 together with one or more other apparatuses forming a manufacturing facility for, e.g., semiconductor devices, the facility including a control apparatus implementing manufacturing optimization technology.

FIG. 3 shows the lithographic apparatus LA and the lithocell LC in the context of an industrial manufacturing facility for, e.g., semiconductor products. Within the lithographic apparatus (or "litho tool" 200 for short), the measurement station MEA is shown at 202 and the exposure station EXP is shown at 204. The control unit LACU is shown at 206. As already described, litho tool 200 forms part of a "litho cell" or "litho cluster" that also includes a coating apparatus SC, 208 for applying photosensitive resist and/or one or more other coatings to substrate W for patterning by the apparatus 200. At the output side of apparatus 200, a baking apparatus BK, 210 and developing apparatus DE, 212 are provided for developing the exposed pattern into a physical resist pattern. Other components shown in FIG. 3 are omitted, for clarity.

Once the pattern has been applied and developed, patterned substrates 220 are transferred to other processing apparatuses such as are illustrated at 222, 224, 226. A wide range of processing steps are implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

The described semiconductor manufacturing process comprising a sequence of patterning process steps is just one example of an industrial process in which the techniques disclosed herein may be applied. The semiconductor manufacturing process includes a series of patterning steps. Each patterning process step includes a patterning operation, for example a lithographic patterning operation, and a number of other chemical and/or physical operations.

The manufacture of semiconductor devices involves many repetitions of such processing, to build up device structures with appropriate materials and patterns, layer-by-layer on the substrate. Modern device manufacturing processes may comprise 40 or 50 individual patterning steps, for example. Accordingly, substrates 230 arriving at the litho cluster may be newly prepared substrates, or they may be substrates that have been processed previously in this cluster 232 or in another apparatus entirely. Similarly, depending on the required processing, substrates on leaving apparatus 226 may be returned for a subsequent patterning operation in the same litho cluster (such as substrates 232), they may be destined for patterning operations in a different cluster (such as substrates 234), or they may be finished products to be sent for dicing and packaging (such as substrates 234).

Each layer of the product structure typically involves a different set of process steps, and the apparatuses used at each layer may be completely different in type. Further, even where the processing steps to be applied by the apparatuses are nominally the same, in a large facility, there may be several supposedly identical machines working in parallel to perform the processing on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. Parallel processing may also be performed in different chambers within a larger apparatus. Moreover, in practice, different layers often involve different etch processes, for example chemical etch, plasma etch, etc., according to the details of the material to be etched, and special requirements such as, for example, anisotropic etching.

The previous and/or subsequent processes may be performed in other lithography apparatuses, as just mentioned, and may even be performed in different types of lithography apparatus. For example, one or more layers in the device manufacturing process which are very demanding in terms of, e.g., resolution and/or overlay may be performed in a more advanced lithography tool than one or more other layers that are less demanding. Therefore, one or more layers may be exposed in an immersion type lithography tool, while one or more others are exposed in a 'dry' tool. One or more layers may be exposed in a tool working at DUV wavelengths, while one or more others are exposed using EUV wavelength radiation.

Also shown in FIG. 3 is the metrology apparatus (MET) 240 which is provided for making measurements of parameters of the products at desired stages in the manufacturing process. A common example of a metrology station in a modern lithographic manufacturing facility is a scatterometer, for example an angle-resolved scatterometer or a spectroscopic scatterometer, and it may be applied to measure one or more properties of developed substrates at 220 prior to etching in the apparatus 222. Using metrology apparatus 240, it may be determined, for example, that a performance parameter such as overlay or critical dimension (CD) does not meet specified accuracy requirements in the developed resist. Prior to the etching step, the opportunity exists to strip the developed resist and reprocess one or more of the substrates 220 through the litho cluster. Moreover, the metrology results from the apparatus 240 can be used to maintain accurate performance of the patterning operations in the litho cluster, by making small adjustments over time, thereby reducing or minimizing the risk of products being made out-of-specification, and requiring re-work. Of course, metrology apparatus 240 and/or one or more other metrology apparatuses (not shown) can be applied to measure one or more properties of the processed substrates 232, 234, and/or of incoming substrates 230.

Typically the patterning process in a lithographic apparatus LA is one of the most significant steps in the processing which involves high accuracy of dimensioning and placement of structures on the substrate W. To help ensure this high accuracy, three systems may be combined in a control environment as schematically depicted in FIG. 3. One of these systems is the litho tool 200 which is (virtually) connected to a metrology apparatus 240 (a second system) and to a computer system CL 250 (a third system). A desire of such an environment is to optimize or improve the cooperation between these three systems to enhance an overall so-called "process window" and provide one or more tight control loops to help ensure that the patterning performed by the lithographic apparatus LA stays within a process window. The process window defines a range of values of a plurality of process parameters (e.g. two or more selected from dose, focus, overlay, etc.) within which a specific manufacturing process yields a defined result (e.g. a functional semiconductor device)—typically a range within which the values of the process parameters in the lithographic process or patterning process are allowed to vary while yielding a proper structure (e.g., specified in terms of an acceptable range of CD (such as +−10% of a nominal CD)).

The computer system CL may use (part of) the design layout to be patterned to predict which one or more resolution enhancement techniques to use and to perform computational lithography simulations and calculations to determine which patterning device layout and lithographic apparatus settings achieve a largest overall process window of the patterning process (depicted in FIG. 3 by the double arrow in the first dial SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second dial SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third dial SC3).

Computer system 250 implements a form of feedback control based on a combination of (i) first data or "pre-processing data" associated with substrates before they are processed in a given processing step (for example a lithography step) and (ii) second data or "post-processing data" that is associated with the substrates after they have been processed. As an example of pre-processing data, computer system 250 has access to context data CDAT. This context data may be data not obtained from the products themselves, but representing all or part of the processing history of individual product units (wafers or other substrates), or batches of product units. As an example of pre-processing data, historic performance data PDAT is illustrated in FIG. 3, which may include for example measurements of overlay and/or CD made by metrology apparatus 240, and context data CDAT associated with individual substrates. Computer system 250 therefore has access to historic performance data PDAT and which is stored in storage 252. Arrows 254 throughout the diagram illustrate how context data may come from any of the apparatuses. Context data may also arrive with the new substrates 230. For example, the context data may record what types of process steps have been applied, which individual apparatuses have been used in the performance of those steps, and what parameters were applied by those apparatuses (for example settings of temperature or pressure while in etching apparatus 222, or parameters such as illumination modes, alignment recipes, etc. in the litho tool 200). The context data is stored in storage 256 for use by the computer system 250.

The performance data PDAT may be regarded as an example of object data used in some embodiments of the techniques disclosed herein. Other examples of pre-processing data may include object data ODAT derived from measurements made (directly or indirectly) on the product units in advance of or during performance of the processing. FIG. 3 shows this object data optionally collected and stored in a database 260. Such object data may be data measured on the product units themselves, or measured on other parts involved in the industrial process. As one example, the object data stored in a database 260 may comprise the alignment data conventionally obtained by the lithographic apparatus 200 using alignment sensor AS in the measurement station 202. As this data representing detailed measurements of positions of marks in the X-Y plane of the substrate is obtained inherently as part of the normal patterning operation, little or no penalty is incurred by instructing the control unit LACU, 206 to store the data in the object data storage 260. Alternatively, or in addition to the alignment data, the object data may include height data obtained using level sensor LS, and/or "wafer quality" signals from the alignment sensor AS or the like. In other embodiments, the object data may include data measured elsewhere in the system, and not on the product units themselves. An example of such object data might be patterning device (mask or reticle) alignment data obtained using the patterning device alignment marks M1, M2 and/or one or more sensors in the one or more substrate supports of the lithographic apparatus of FIG. 1.

The term "object data" as used in in this description may encompass a wide variety of data that may be gathered in the manufacturing facility, either for historic product units, or new product units to be processed. "Object data" as used in herein may encompass both the performance data PDAT (measured from processed product units after processing and stored in storage 252) and the other types of object data ODAT (measured from product units or other systems before and/or during processing and stored in storage 260). Depending on context, this object data may be "pre-processing data" or "post-processing data". Object data collected in advance of a particular processing step, including for example alignment data or height data measured immediately prior to exposure of a substrate, may be regarded as a form of pre-processing data as described herein. The same object data may be regarded as performance data, i.e. post-processing data, with respect to a previous processing step. For example, alignment marks may contain fingerprints of previous etching or polishing steps. Therefore, in some embodiments, a piece of object data may serve as post-processing data (historic performance data) in the control loop of one processing step, and as pre-processing data (similar to the context data) in the control loop of a later processing step.

While FIG. 3 shows separate storage 252, 256, 260 for each of the context data, performance data and other object data, it will be appreciated that these different types of data may be stored in one common storage unit, or may be distributed over a larger number of storage units, from which particular items of data can be retrieved when required. Further, while the context data 254 is shown as emanating from individual apparatuses 222, 224, etc., the data may be collected through a central control system that controls the operation of the lithocell and/or the manufacturing plant as a whole.

Each record in the object data, context data and performance data storage is labeled with a unique identifier. Noting that an individual substrate might pass repeatedly through the same litho tool in the course of a manufacturing process, or might pass through different tools all measuring the same marks, it is possible to collect data for the same product unit at different stages of the manufacturing process. Each of these instances of measurement can be treated in the analysis as an independent product unit. In the case where there are multiple instances of the same substrate being measured at different stages in a complex manufacturing process, however, the object data will include an identifier that uniquely identifies not only the individual substrate, but the stage of processing in which it has been measured. Typically, in a lithographic process, different instances of the same substrate will be associated with patterning successive layers of a device structure.

A relatively new technology area is the domain of machine learning. Methods relating to this technology are nowadays used to improve prediction of process parameters based on recognition of patterns present within the acquired data (measurements and context data). Additionally, machine learning techniques may be useful to guide the user in selecting data that is most useful for process control purposes.

As a (semiconductor) manufacturing process involves multiple processing apparatuses (lithographic apparatus, one or more etching stations, etc.) it may be beneficial to optimize the process as a whole, e.g. take specific correction capabilities associated with individual processing apparatuses into account. This leads to the perspective that control of a first processing apparatus may be (partly) based on one or more known control properties of a second processing apparatus. This strategy is commonly referred to as co-optimization. Examples of such a strategy are the joint optimization of a lithographic apparatus and a density profile of a patterning device and/or a lithographic apparatus and an etching station. More information on co-optimization may be found in PCT Patent Application Publication Nos. WO 2017/067748 and WO 2017/144343, which are incorporated herein in their entireties by reference.

In some process control situations, the control objective may be, for example, "number of dies in spec"—typically being a yield driven process control parameter to obtain a maximum number of functional products (typically a product is associated with a die on a substrate, hence often yield based process control is referred to as based on a "dies in spec" criterion) per batch of processed substrates. To obtain good yield based process control, a sampling scheme for metrology measurements may benefit from measurements performed at, on or near locations which are expected to be most critical for yield and/or may be statistically most relevant to determine whether yield is affected. Apart from measuring one or more properties of product features also occurrence of defects may be measured to further assist in optimizing the process for optimal yield (reference defect inspection). More information on yield based control may be found in European patent application, no. EP16195819.4, which is incorporated herein in its entirety by reference.

As discussed, context data may be used for purposes of process control. Machine learning techniques may be utilized to recognize patterns in context data and subsequently relate them to an expected impact on one or more characteristics (such as overlay, CD, edge placement error (EPE), etc.) of substrates being subject to a process. Known methods depend on the availability of historic post-processing data, such as overlay data, CD data or yield data as measured on a large set of processed substrates for which also pre-processing (context) data (data associated with substrates prior to undergoing a certain process of interest) is available. To relate these two classes of data typically the post-processing data is clustered based on well-known methods such as k-means and/or PCA analysis. Subsequently, relations between the post-processing data clusters and pre-processing data is established, in order to formulate a model capable of assigning to be processed substrates to a certain expected characteristic of post-processing data, based purely on its associated pre-processing data. Examples of such systems are described in PCT patent application publication no. WO 2017/060080, which is incorporated herein in its entirety by reference.

In a few cases the pre-processing data has a limited set of associated parameters. For example, when only an ID of an etch chamber is recorded to characterize the pre-processing data associated with to-be-processed substrates. In this case it is often straightforward to establish a relation between a cluster of substrates pertaining to a certain cluster of post-processing data and a value of the parameter comprised within the pre-processing data. In an example a certain cluster of substrates associated with a certain class of overlay data (fingerprint) may be assigned to a value of the etch chamber ID, e.g., substrates associated with prior processing by chamber 2 may for example be linked to radial overlay fingerprints while substrates associated with prior processing by chamber 5 may for example be linked to saddle-shaped overlay fingerprints. Hence when it is known that a to-be-processed substrate has passed via etch chamber 5 the process (control) can be adjusted to compensate a saddle shaped overlay fingerprint by applying an adequate overlay correction to the process (for example, to a lithographic process).

In general, however, pre-processing data typically comprises many parameters. In a modern semiconductor manufacturing facility (generally referred to as a "fab" or "wafer fab" for short) many parameters and potential values associated with these parameters can be registered for many processing tools and may potentially be used for context based control purposes. In such cases it is less obvious how to adopt the previously described method to cluster post-processing data and subsequently assign these clusters to a certain parameter (value) sub-space comprised within the pre-processing (e.g. context) data. The number of possible configurations of partitioning the pre-processing data into smaller sets (subsets) is simply too large.

The present disclosure proposes to adopt a different approach for large sets of pre-processing data comprising a multitude of associated parameters. Having pre-processing data and post-processing data associated with a set of substrates, a decision tree algorithm, for example a recursive decision tree algorithm is deployed. Effectively the recursive decision tree algorithm searches through many configurations of partitioning the substrates into subsets by applying a plurality of partition rules to subdivide a parameter space defined by the parameters of the pre-processing data. A partition rule is basically a recipe for partitioning a data set into subsets. For example a partition rule could be a decision to split pre-processing data set into two subsets; one subset for which the parameter 'etch chamber' equals "A" and the other subset for which the etch chamber is different from "A" (NOT A). Of course, more complicated partition rules may be defined that involve multiple parameters, mathematical operations and/or checks on parameters. Parameters may include "categorical" parameters (e.g. polishing or not; chamber A or not) or continuous variable parameters. In the latter case, the dataset can be partitioned according to whether the parameter has a value within a numerical interval from a set of non-overlapping numerical intervals. In the case of utilizing a recursive decision tree algorithm, the partition rules at a series of decision steps or nodes define the decisions.

It is a goal of the recursive decision tree algorithm that each step (branching point) of the finally obtained decision tree splits the pre-processing data parameter space into two sub-spaces, and hence splits its associated set of substrates into two or more subsets (groups) characterized in that at least one group of substrates demonstrates a certain (typically a desired) characteristic when viewed in terms of its associated post-processing data. In this fashion the subsets of the pre-processing data space are linked to a certain characteristic of the post-processing data. Effectively the problem of finding optimal grouping (clustering) of substrates and predicting what characteristic group of post-processing data is associated with each substrate group (purely based on pre-processing data) is then solved in one go. The partition rule associated with a desired partitioning of the pre-processing data serves then as a means for grouping the substrates and assigning to each group of substrates an associated characteristic of its post-processing data.

Figure 4:
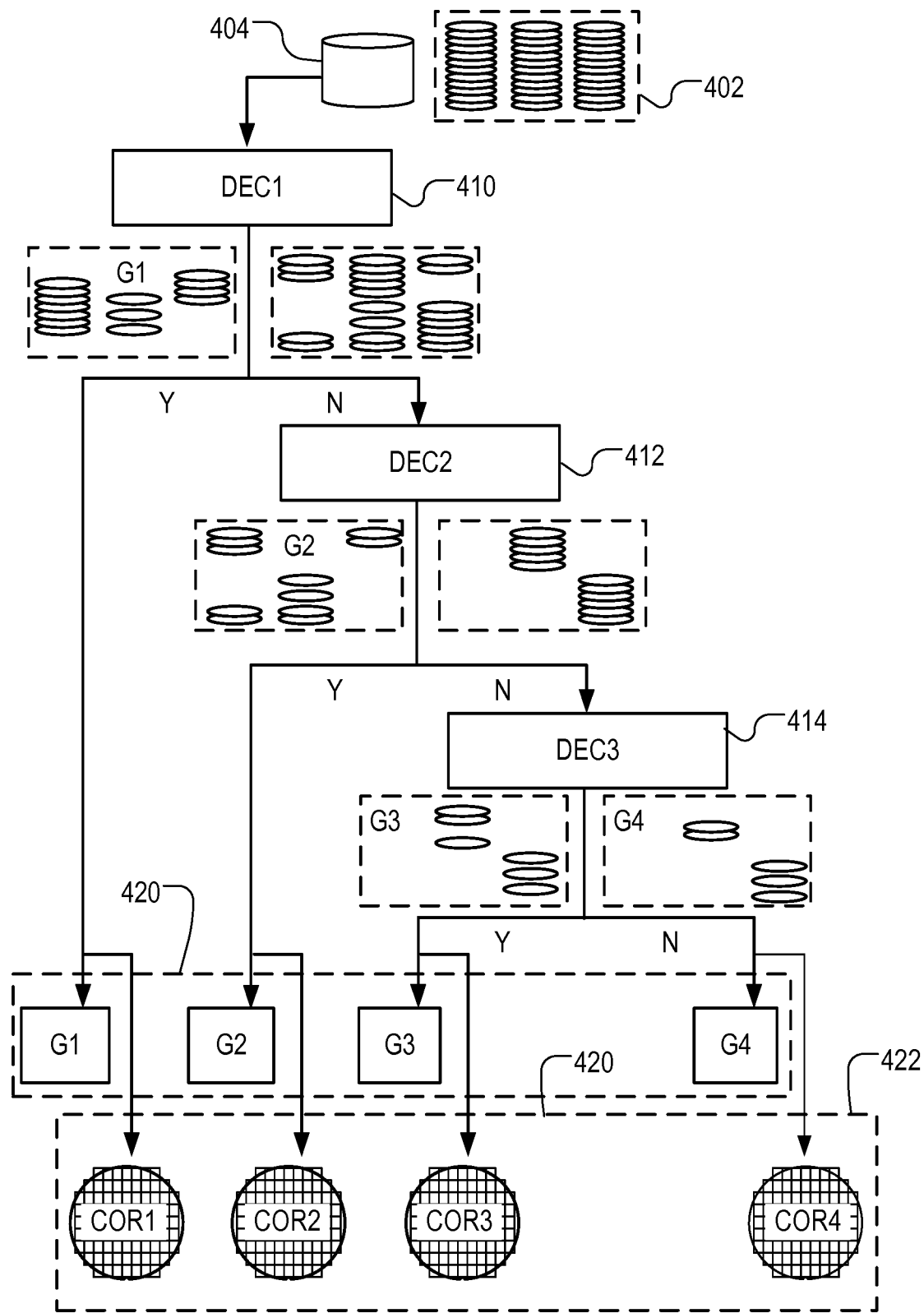
FIG. 4 depicts a decision tree according to an embodiment of the invention.

FIG. 4 depicts an embodiment of this principle. In this simplified example, overlay coefficients may be determined from context data associated with a pre-processing history of one or more to-be-processed substrates. It will be understood that overlay is just one example of a performance parameter of a lithographic manufacturing process, and similar methods can be applied to process other performance parameters, for example CD. A set of substrates is represented schematically at 402. Pre-processing data 404 comprises context data, for example information relating to what substrate (wafer) is processed in what tool, in what chamber of a tool (in case the tool has more than one chamber, like an etcher) and/or in what slot of a tool. A decision tree algorithm (in the illustrated example, a decision list), comprises decision steps 410, 412, 414, forming nodes of the decision tree. Each decision step applies a node partition rule based on the value of a parameter in the pre-processing data 402. The decision list is an example of a recursive decision tree, meaning that the same parameter(s) can be examined in more than one decision step. By running the recursive binary decision tree algorithm based on the pre-processing data, the parameter space defined by the pre-processing data is divided into four sub-spaces. By virtue of the training (described further below), each of these sub-spaces is associated with a certain characteristic of the post-processing data (in this case overlay data across the substrate). For a set of substrates 402 having pre-processing data 404, the partitioning of the parameter space has the effect of defining a subset of any given set of substrates. The set of substrates 402 is thus divided into subsets labeled G1 to G4 in FIG. 4, each subset relating to substrates having associated pre-processing data complying with the applied partition rule. Note that each node may have a partition rule, and the resulting tree can also be referred to as defining a partition rule which is the combined effect of the nodes' partition rules. As referred to herein, the "selecting of a partition rule" refers to selection of a decision tree, which could be a single node partition rule, but is more likely to be a series of nodes forming a larger decision tree.

In step 420, the decision tree is used to assign each substrate to a particular subset or "bin" G1 to G4. From this, in step 422 a characteristic of the post-processing data observed in the corresponding subsets of the training set of substrates is used to define a fingerprint that is output as a correction to the process step. This correction is specific to each subset G1-G4 is shown schematically in FIG. 4, and labeled COR1 to COR4. In processing the set of substrates, the litho tool LA can thus be controlled by computer system CL to apply these corrections, and improve overlay performance of the manufacturing process, relative to the training set.

For a decision tree based on pre-processing data whose parameters represent steps in etch chambers or the like, interfield fingerprints and corrections are to be expected and this is illustrated schematically in FIG. 4. In other embodiments, some or all of the node partition rules may relate to parameters that are associated with intrafield fingerprints, and intrafield corrections may be generated.

Figure 5:
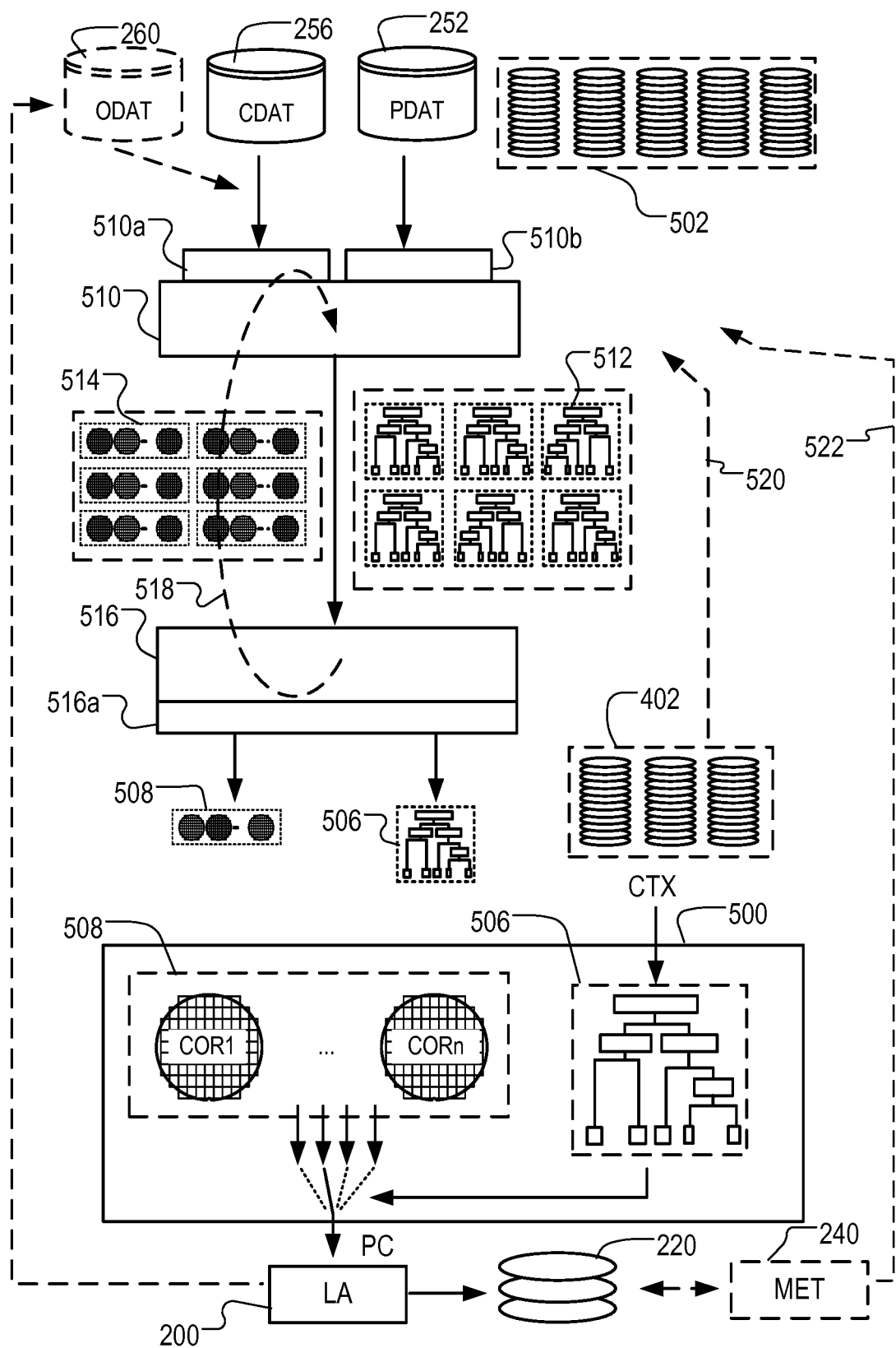
FIG. 5 illustrates schematically a feedback controller and a training method, applying the principles of the decision tree illustrated in FIG. 4 in the manufacturing facility of FIG. 3.

FIG. 5 is a flowchart of a method implemented by the computer system CL to train a decision tree based on training set of substrates 502 and then to apply that training to apply corrections in the processing of subsequent substrates, based on the principles illustrated in FIG. 4. Elements of the manufacturing facility of FIG. 3 that play a role in the method are labeled accordingly.

A feedback controller 500 is shown at the bottom of FIG. 5, being implemented within the computer system CL, and/or within the lithographic apparatus control unit LACU (FIGS. 1 to 3). A set of substrates 402 is to be processed through litho tool 200. Feedback controller 500 stores partition rules 506 defining a decision tree to process a parameter space of parameters of pre-processing data CTX, and stores process corrections 508 for different sub-spaces of the parameter space defined by the decision tree. Before each substrate is processed by litho tool LA, controller 500 chooses the appropriate process correction PC for a current substrate, using the pre-processing data associated with the current substrate. Where the control system allows it, process corrections can be chosen and applied on a per-substrate basis, or they may be applied per lot if desired.

Referring now to the upper part of FIG. 5, in a training phase the recursive binary tree decision tree algorithm searches the parameter space defined by the pre-processing data based on pre-processing data 256 and post-processing data 252 of a training set of substrates 502. More specifically machine learning approaches may be used to iteratively search for an adequate decision tree operating within a parameter space of the pre-processing data such that it is usable for partitioning substrates into subsets, each subset desirably having, e.g., a minimal variation of an expected post-processing characteristic (such as overlay, CD, focus, EPE, etc.). Finding an adequate (or desirably: optimal) decision tree for partitioning future substrates may be done, depending on the format of the context data, using machine learning algorithms such as ID3, C4.5, CART, C5.0, CHAID, QUEST, CRUISE, etc.

FIG. 5 illustrates this training process schematically in steps 510 to 516. It will be understood that these steps may be performed in different ways depending on the chosen algorithm and chosen implementation. The steps may be performed partially and iteratively, as illustrated by the loop path 518. Conceptually, in a step 510 a number of candidate decision trees 512 are generated, partitioning the parameter space in different ways. For each candidate decision tree a corresponding set of fingerprints 514 can be calculated and, based on these or on equivalent data, the quality of the prediction of performance can be judged, between the different models. The "best" set of partition rules is then selected and stored as the partition rules 506 in the feedback controller 500. The corresponding set of corrections COR1-CORn is stored as the corrections 508 in the feedback controller 500.

Figure 6:
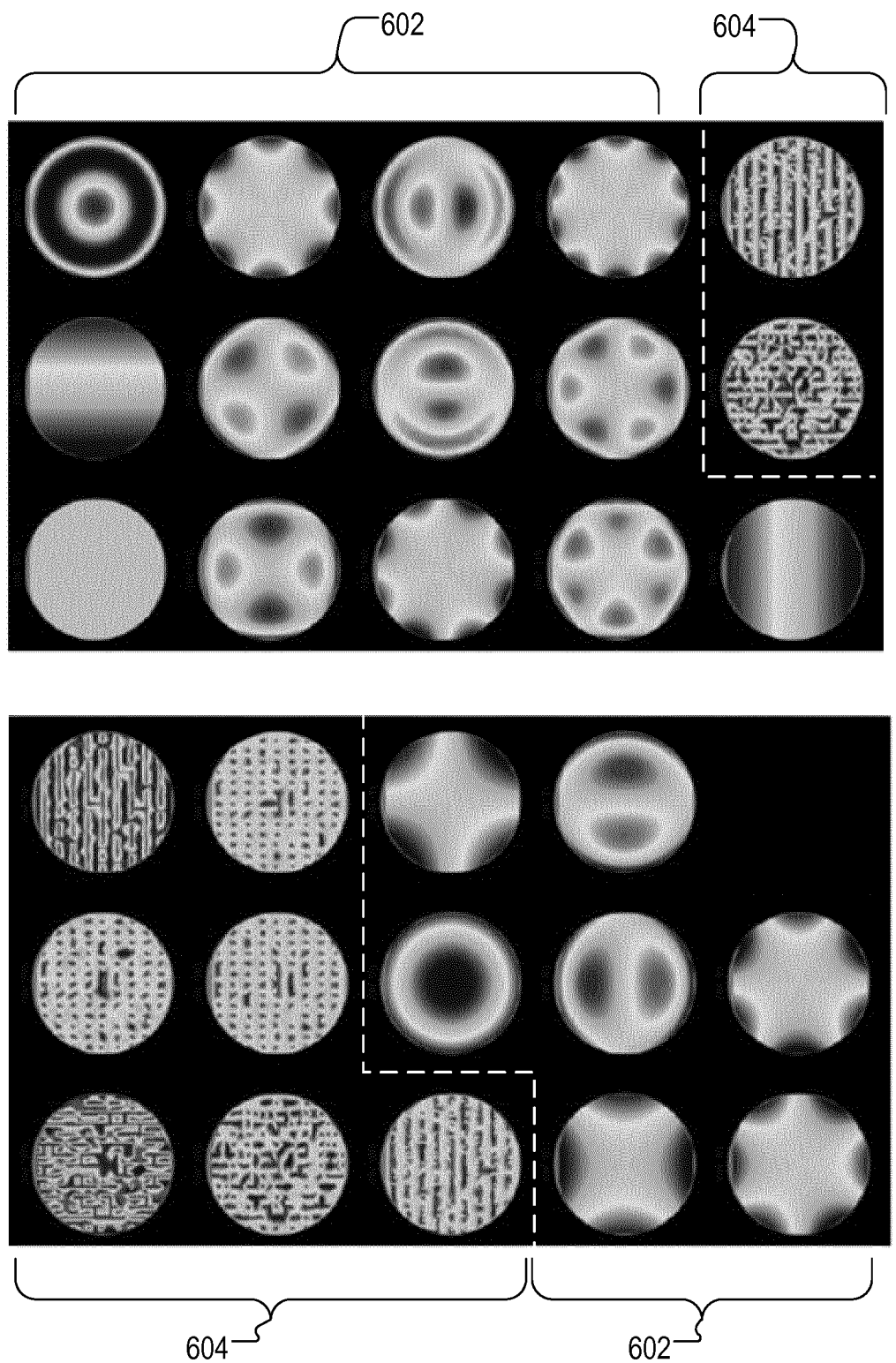
FIG. 6 depicts interfield and intrafield components that may be used to define fingerprints and corrections in the method of FIG. 5.

Referring to FIG. 6, it will be appreciated that fingerprints may be expressed in any suitable form, both for the purposes of finding the best decision tree and for expressing the resulting corrections. FIG. 6 illustrates a set of fingerprint components that can be combined in a weighted fashion to define a variety of interfield and/or intrafield fingerprints. Each fingerprint or correction COR1-CORn can then be expressed as a set of coefficients for weighting these component fingerprints. For interfield variations, components 602 can be defined for example through Zernike polynomials. For intrafield variations, nine different components are illustrated, like the ones labeled 604. These intrafield components are represented only schematically on the scale of FIG. 6, and FIG. 6 exhibits artifacts of the low sampling resolution. The skilled reader will understand this and will also be able to envisage other example schemes for modeling the fingerprints.

Once the decision tree has been established it may be used to partition a new set of substrates 402, as described. Typically, this new set of substrates is not part of the set of substrates 502 used to determine the decision tree using the recursive decision tree algorithm. However, as shown by the broken data paths 520 and 522, pre-processing data and/or post-processing data from newly processed substrates can be added to the databases 252, 256, 260 and steps 510 to 518 then repeated to update the decision tree on a continuous, or regular or irregular basis.

In order to judge the "best" set of partition rules (step 516), a variety of performance metrics (key performance indicator or KPI) may be considered. As one example, predictive residual reduction (PRR) may be employed. To illustrate this, consider a measurement of overlay error as a performance characteristic across a set of substrates. Across all measurement positions across all substrates, a statistical distribution of the measurements will exhibit a certain mean m and a certain standard deviation. (Overlay is typically measured separately in the X and Y directions, and the statistical distribution will be different for each direction.) A performance metric "m3s" can be defined as the mean error plus three times the standard deviation. It will be understood that, in one situation the overlay error may be relatively large (large mean value, low standard deviation), while in another situation the average error could be zero, but the samples may vary widely (zero mean, large standard deviation). The performance metric m3s combines these situations into one comparable value. It will be understood that in the second situation, the correction to be applied will not be obvious. However, by applying the decision tree analysis to distinguish different context parameters that cause deviation in particular samples (particular substrates, and/or particular positions across the substrate and/or particular positions within each exposure field) corrections tailored to different subsets of the substrates can hopefully improve performance.

Consider then a value $m3s_0$ that is the average m3s of sample set of number #w substrates, prior to application of the decision tree and corrections:

$$m3s_0 = \mathrm{mean}(\{m3s(w_i)\}, i=1, \ldots \#w)$$

where $w_i$ represents the set of overlay values measured across a single substrate and #w is the number of substrates in the sample set.

Any of the candidate decision trees 512, together with its associated set of corrections 514 constitutes a predictive model M of the overlay performance. After applying this predictive model M, the residual average m3s for the substrates can be called $m3s_M$:

$$m3s_M = \mathrm{mean}(\{m3s(w_i - w_{iM})\}, i=1, \ldots \#w)$$

where $w_{iM}$ is the correction that would be applied to each individual substrate, according to that particular predictive model M. This residual average m3s is a measure of performance of the model that should be minimized, for best correction.

A normalized "predictive residual reduction" (PRR) measure can also be defined for the model M, for example by the formula:

$$PRR(M) = (m3s_0 - m3s_M)/(m3s_0)$$

The PRR measures what fraction or percentage of the overlay error is corrected by the predictive model M, relative to the error on the original substrates. Since the measure PRR increases as $m3s_M$ decreases, PRR is a measure that should be maximized, for best correction. Therefore a suitable KPI or performance metric for the predictive models is provided, which can be used to select between the different candidate decision trees.

While the training process defined schematically in the steps 510-518 can be fully automated and performed with "brute force", various refinements and constraints can be applied, in automated and/or human expert steps, to improve overall performance in a desired application.

As one refinement, one or more preparatory steps 510a can be performed on the pre-processing data. One preparatory step may be a filtering step, to remove redundancy and reduce the number of dimensions of the parameter space in which the decision tree is to be searched. The filtering step can be automated and/or manually guided. For example, when after gathering the context data for all the training set 502, certain data fields may be incomplete over the set, and can be excluded automatically. Certain data fields will have values unique to each substrate and can be excluded. Certain data fields will have values that are constant over all substrates and these can be excluded. Certain data fields will be 100% correlated with other parameters such as Lot ID.

Another option is to filter pre-processing data by human and/or automated recognition of certain patterns of the variation in post-processing data. Certain patterns of variation or fingerprints may point to its root causes based on process knowledge. That knowledge can then be used to pre-filter pre-processing data to give extra weight to the subset of pre-processing data that relates to that root cause and is more likely to be relevant. The process knowledge can be encoded in an automated machine expert, or applied by a combination of human intervention and machine assistance.

Some transformation of the pre-processing data can also be performed as a preparatory step 510a. The pre-processing data is not necessarily defined within a parameter space corresponding to individual parameters comprised within the raw pre-processing data. For example, linear or non-linear combinations of parameters may be used to represent the pre-processing data more effectively (as utilized for example in methods of reducing dimensionality of a problem).

A preparatory step 510b may be performed on the post-processing data (performance data). The skilled reader will be able to envisage a wide range of useful preparatory steps, including for example outlier filtering and/or applying relevant transformations and/or projections into a different parameter space. Such transformations and projections can enhance partitioning and may include, purely as examples, modeling using a parameterized model, one-hot encoding and/or principal component analysis (PCA). Techniques from the PCT patent application publication no. WO 2017/060080 may be adapted for this purpose, for example.

Further optimization of the learning algorithm may be done using K-fold cross-validation methods. These methods may be used to optimize hyper-parameters of the learning algorithm such as the number of terminal nodes, tree depth, etc. Principles of this will be illustrated below, with reference to FIG. 7.

If necessary, merging of sub-spaces (subsets of substrates) may be done after the decision tree has been defined, to mitigate a too granular splitting into subsets due to recursive binary splitting strategies in the learning algorithms. This merging can be performed by machine programming (clustering) and/or by human intervention.

Further the learned decision tree may be manipulated by an expert to account for sources of post-processing variations which are not included in the pre-processing (context) data used in the learning phase. The effect of changes may be validated using "hold-out" datasets. The hold-out data can be any data that has not been used in the training and cross validation.

Further it is noted that the proposed partitioning effectively provides grouping (categorization) in the context data domain. Context data may be any data that is available before performing an action associated with a process or control strategy. The decision tree is subsequently used to derive a substrate specific control action before performing an action. The context data for this purpose may therefore include object data measured from the individual substrate, even after it has been loaded into the litho tool LA. This data may be parameterized rather than being used in a raw form, of course.

Reviewing now the operation on new (to-be-processed) substrates, as explained above, partitioning based on the available pre-processing data associated with the new substrates is done first. For each partition (which can also be referred to as a subset/bin/group/cluster within the total set of new substrates) a certain characteristic of post-processing data may be determined and an appropriate process correction may be derived. Examples of such a post-processing fingerprint are: overlay fingerprint, CD fingerprint, yield fingerprint, focus fingerprint, and/or EPE fingerprint.

Various control strategies may be adopted based on the availability of the decision tree relating the pre-processing data to post-processing data (and hence to process correction properties).

First, a substrate level control type (WLC) may be implemented, in which the process correction is applied per individual substrate (substrate level control principle). As pre-processing data is available before the process commences, the process correction may be determined and applied per substrate on the fly.

A second type of control strategy is referred to as "run-to-run" control. In this case, after performing a process step, measurements on the processed substrates and/or process data analysis are performed and used to optimize processing of the subsequently processed substrates. In this case, the grouping of substrates established by the decision tree can be used to select appropriate corrections in the run-to-run control. The pre-processing and post-processing data for new lots may be used to further enhance the quality of the decision tree by using the recursive decision tree algorithm on the updated pre-processing data set. However, care should be taken when using the data not to double-correct by using the same data as input for the decision tree algorithm and for the run-to-run correction.

Figure 7:
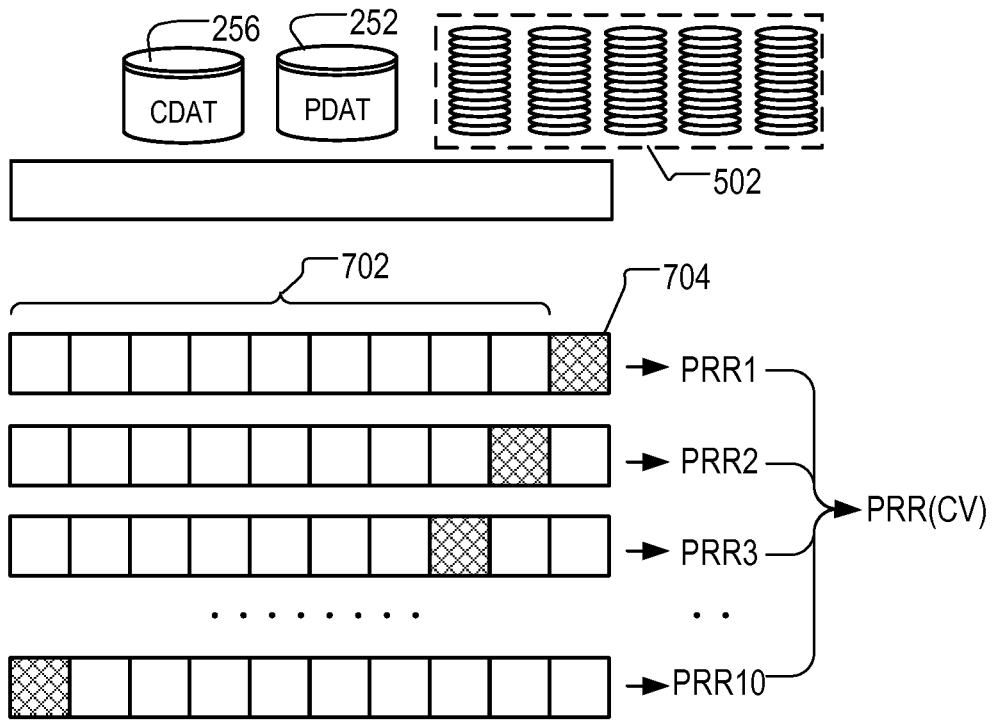
FIG. 7 illustrates schematically cross validation (CV) of a candidate predictive model based on a decision tree.
Figure 8:
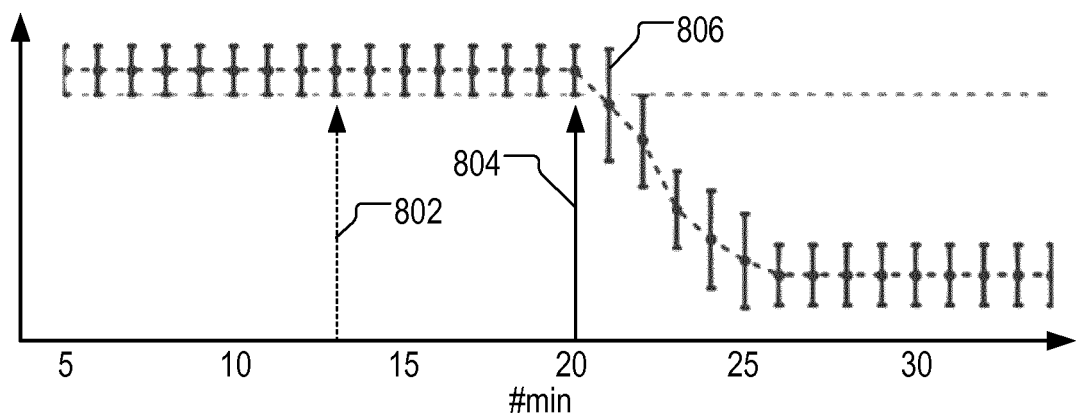
FIG. 8 illustrates how results of cross validation can be used to choose, either automatically or with human guidance, constraints to apply on the decision tree learning.

FIG. 7 illustrates schematically cross validation (CV) of a candidate model to determine how robust is the PRR performance metric, in other words, how well it will work for sample sets different to the one used for training. FIG. 8 illustrates how results of cross validation can be used to choose, either automatically or with human guidance, the best constraints to apply on the decision tree learning.

In FIG. 7, a full set of training samples (substrates) is represented at 502, the same as in FIG. 5. The quality of the decision tree may be verified by partitioning pre-processing and post-processing (training) data into subsets and verifying the model at least on one set which is not used to establish the model. For example, dividing the training set into 10 subsets, the decision tree learning is performed using nine of the subsets as training data 702, and then evaluated for its ability to predict and correct errors in the tenth subset 704. This is repeated 10 times, to give 10 different performance metrics PRR1 to PRR 10 for the same decision tree algorithm. These can then be combined, for example by a simple average, to provide a cross-validated performance metric PRR(CV) for the decision tree algorithm as a whole. It will be understood that the division into subsets is performed entirely in the domain of the pre-processing data and the post-processing data associated with the training set of substrates. The cross-validation process does not require physically processing the substrates. Cross-validation can be used as a technique both to evaluate different decision tree algorithms, and to evaluate candidate decision trees as part of step 516 (e.g., as step 516a) within a decision tree algorithm.

Referring now to FIG. 8, using the cross-validated performance metric for different decision tree algorithms allows areas parameters and constraints of the algorithm itself to be adjusted. These may be referred to, for example as "hyper-parameters". As a particular example of a hyper parameter for a decision tree algorithm, the parameter #min defines the smallest number of substrates that should remain at a "leaf node" of the decision tree. That is to say, if a decision leads to a branch containing fewer than #min substrates, that decision will not be included in the decision tree and the decision tree will terminate at a leaf node instead.

The graph in FIG. 8 shows cross-validated performance metric PRR(CV) for a number of different values of #min, running the cross-validation method of FIG. 7 on a particular set of substrates. The number of substrates may be several hundreds or even thousands. The values of #min range from five at the left-hand side of the graph to over 30 at the right hand side. In the particular measure used, increasing values of PRR indicate better models. Also, not only a mean value for the performance metric is plotted, but a range of deviation of the performance metric between the different training and validation subsets 702/704. In the illustration of FIG. 8, the range of deviation of the performance metric over the values PRR1-PRR10 is represented by "error bars" 806. It can be seen that, if #min his set too high, above 25, say, the decision tree algorithm does not yield the highest performance possible. On the other hand, reducing the minimum leaf node size below 20 yields only minor, if any improvement in the performance. Too small to see on the scale of FIG. 8, the absolute best performance is achieved with #min equal to 13 (dotted arrow 802) in this example set of data.

On the other hand, the range of variation among the candidate models may increase, as the size of a leaf node becomes smaller than the optimum. Too small to see on the scale of FIG. 8, the narrowest range of variation among all the options tested is actually achieved with #min equal to 20 (solid arrow 804) in this example set of data. This minimum variation indicates a good capacity of the particular algorithm to generalize from training samples to the production environment. Accordingly, in one implementation, the parameter #min is set to 20 for the steps 510-518. In other implementations, the setting of these hyperparameters can be adjusted as part of the iterative process, and revised from time to time to maintain optimum performance.

In many of the examples provided, the pre-processing data comprises categorical data such as context data i.e., was tool A used to process a substrate. It is known that that, when partitioning categorical data using decision tree algorithms or similar techniques, the number of possible partitions at each node is $2^{(M-1)}-1$, wherein M is the number of categories or groups. It will therefore be appreciated that, for a large number of categories, the number of possible partitions at each node becomes prohibitively large. This makes it difficult to determine an optimal partition structure (e.g., using a direct search approach). This potentially places a significant limitation on the applicability of the above method for high volume manufacturing applications.

In the above description, an optional preparatory step 510b is described for performing on the post-processing data (performance data). One-hot encoding and/or principal component analysis (PCA) are examples provided for such a preparatory step 510b. In multiple-output decision tree algorithms, one-hot encoding may be used to transform categorical context variables into a binary indicators. However in case of a large number of context variables such algorithms may suffer from a large number of possible decision node configurations. In addition the partitioning may be suboptimal as only a subset of all possible decision nodes are achievable when converting context variables to binary decisions. Where the target variable is a scalar value or binary classes, it is also possible to determine an order based on the average value of the corresponding target variable. However, where the target value is vector valued, as is the case for example when the target value is overlay, determining an order in such a manner is non-trivial.

To address this, an alternative partitioning method and/or preparatory step 510b for the above described partitioning method is proposed. Such a step may comprise a feature encoding step for determining one or more initial partition rules; e.g., to impose a degree of ordinality to the pre-processing data. The result of the encoding step may be spectrally coded pre-processing (categorical context) data, which may then be partitioned based on the spectral code. In particular, the spectral code may be used to determine one or more initial partition rules (decisions).

The proposed method uses spectral graph analysis to determine a lower-dimensional representation (e.g., a lower dimensional proximity map) of target values, for example vector target values such as overlay, for each one of the categorical context variables. Coordinates from the lower-dimensional representation can then be used (e.g., as a real vector value) to encode the categorical values. Spectral graph analysis is the study of the properties of a graph in relationship to the characteristic polynomial, eigenvalues, and eigenvectors of matrices associated with the graph, such as its adjacency matrix or Laplacian matrix.

Figure 9:
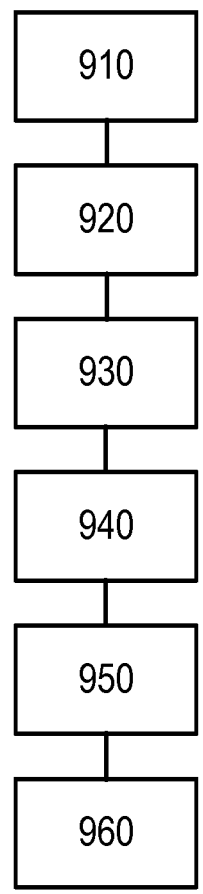
FIG. 9 is a flowchart of a method according to an embodiment of the invention.

FIG. 9 is a flow diagram describing the proposed method. At step 910, first data or pre-processing data and associated second data or post-processing data is obtained. The post-processing data may be any of the examples already provided (e.g., one or more of: overlay data, alignment data, CD data, EPE data, leveling data and/or substrate height map data). In an embodiment, the post-processing data may comprise vector valued data, e.g., overlay data. As already described, the post-processing data is associated with pre-processing data; for example: context data (e.g., a chamber ID of an etch apparatus).

At step 920, a representative post-processing data metric is determined per context data characteristic. By way of a specific example, the overlay data maps or fingerprints are aggregated (e.g., averaged) per categorical value (e.g. etch chamber ID) to obtain an aggregate or average overlay fingerprint per categorical value. However, averaging is only one example of processing the post-processing data to determine a representative post-processing data metric. Other methods comprise one or more of: averaging, summation, subtraction, multiplication, filtering or any aggregation of the post-processing data. The output of this step is a plurality of groups of post-processing data, each with a corresponding representative post-processing data metric.

At step 930, a distance metric is determined, the distance metric describing the distances between each pair of groups comprised in the plurality of groups, according to their corresponding representative post-processing data metrics. In an embodiment, the distance metric may comprise pair-wise distance matrix D, with rows and columns defined by each categorical value and each entry describing the distance between the corresponding representative post-processing data metrics for that pair of categorical values. The distance metric may be Euclidean or cosine based, for example.

At step 940, a fully connected graph is determined based on the distance or degree of adjacency between the group pairs, and therefore based on the distance matrix or a transformation thereof. In an embodiment, the distance metric may be first transformed into an adjacency metric, the adjacency metric describing a measure of adjacency between each pair of groups comprised in the plurality of groups. The adjacency metric may comprise a soft adjacency matrix with elements having a value between 0 and 1 representing the degree to which two nodes are adjacent. As such, the transformation transforms distance (a positive value in [0 ∞) showing dissimilarity between nodes) to interval (0, 1] where 1 indicates exactly the same with the value decreasing with increasing dissimilarity. In a specific example, the adjacency matrix may be calculated according to:

$$a_{i,j} = e^{-\lambda d_{i,j}}$$

where $a_{i,j}$ are individual elements of adjacency matrix A, $d_{i,j}$ are the corresponding individual elements of distance matrix D and $\lambda$ is a constant.

At step 950, a spectral code is determined based on the fully connected graph, such that each of the categorical variables (and therefore groups of post-processing data) is assigned (encoded with) a spectral code value. The aim of this step is to code the distance (adjacency) matrix representation in a sparse manner. This can be achieved in a number of ways, as will be apparent to the skilled person. The approach described here achieves this via a subset of eigenvectors.

As such, the approach described may comprise calculating the Laplacian from the adjacency matrix A, and calculating the eigenvectors V0, V1, V2 . . . etc.) from the Laplacian. The first few non-constant eigenvectors (V1, V2, . . . Vn; n<k, where k is the number of categories/groups) are used as spectral code for corresponding categorical variables represented by each graph node. In an embodiment, eigenvectors of the Laplacian matrix are determined and ranked and a subset of the ranked eigenvectors are selected based on their eigenvalues and subsequently used for grouping of the context data. The non-constant eigenvectors of the Laplacian of the graph reveal information in the spectral domain; eg. expressing invariants of the graph indicative of the level of smoothness in the response of the post-processing data (e.g., overlay) to changes in categorical values.

At step 960, the context data (and therefore the corresponding post-processing data is grouped based to their relative proximity in the spectral code space (e.g., according to the closeness of the spectral code values corresponding to each group, indicative of a larger degree of adjacency). Groups being close to each other may be assigned, for example, to the same group of context data, at least according to an initial decision or partition rule. This is an example of an embodiment targeted to partitioning context data based on characteristics of post-processing data associated with the context data. A clustering algorithm, for example, may be used to perform this grouping step.

Figure 10:
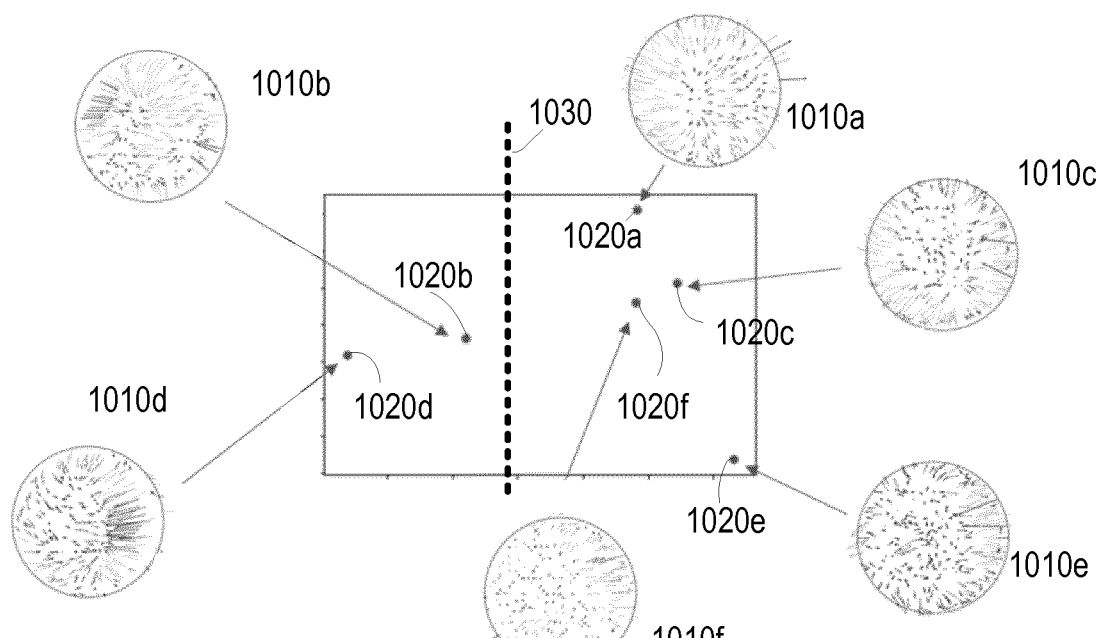
FIG. 10 is a spectral plot and associated data illustrating the final step of the method of FIG. 9.

FIG. 10 illustrates an example of step 960. It shows six groups, each represented by a representative post-processing data metric or average overlay fingerprint 1010a-1010f, and each having a corresponding spectral code represented by a point 1020a-1020f in a plot of the spectral code space. The spectral code can be used to groups according to a spectral clustering on the spectral code. In the specific example here, it might be determined that points 1020b and 1020d on a first side of a decision boundary 1030 is grouped in a first spectrally coded group 1040a and that points 1020a, 1020c, 1020e and 1020f on a second side of a decision boundary 1030 is grouped in a second spectrally coded group 1040b. The method, for example, can then be used to pre-group context data prior to performance of the previously described method of partitioning data (e.g., as part of preparatory step 510b). To use a specific illustrative example, where each average overlay fingerprint 1010a-1010f and corresponding point 1020a-1020f relates to a particular etch chamber A to F (where fingerprint 1010a corresponds to chamber A etc.), the first decision of a decision tree may be determined to be: "was one of etch chambers B or D used?—yes/no".

The disclosed methods to group the context data may be based on spectral encoding of the context data using the methods as described in FIG. 9 and the accompanying description. In addition the context data may be grouped based on a method of spectral clustering. The method of spectral clustering is based on the post-processing data and its associated context data.

In an embodiment, a method of grouping data is disclosed, the method comprising: obtaining context data associated with a manufacturing process; obtaining post-processing data associated with the context data; and utilizing a method of spectral clustering to group the context data into clusters based on the post-processing data and the context data.

In an embodiment, a subsequent step of partitioning the grouped context data using a decision tree algorithm applied to the grouped context data is performed.

Further embodiments are disclosed in the list of numbered embodiments below, which relate to the determination of the partition rule (e.g., the decision tree):

1. A method for partitioning data associated with substrates undergoing a process step of a manufacturing process, the method comprising:
    obtaining first data associated with substrates before being subject to the process step;
    obtaining second data associated with substrates after being subject to the process step;
    applying a plurality of partition rules to the first data to obtain a plurality of configurations of subsets of the first data; and
    selecting a partition rule based on a characteristic of the second data that are associated with the subsets of the first data obtained by applying the partition rule to the first data.
2. The method of embodiment 1, wherein a decision tree training algorithm is utilized to perform the steps of applying the plurality of partition rules and selecting the partition rule.
3. The method of embodiment 2, wherein the training algorithm is a recursive binary decision tree algorithm utilized to perform the steps of applying the plurality of partition rules and selecting the partition rule.
4. The method of embodiment 3, wherein the decision tree algorithm is trained using one or more decision tree training algorithms, such as ID3, C4.5, CART, C5.0, CHAID, QUEST, and/or CRUISE.
5. The method of any of embodiments 2 to 4, further comprising evaluating the training algorithm using cross-validation and selecting parameters of the training algorithm in accordance with the evaluation, for example in the case of a binary decision tree algorithm selecting parameters such as number of terminal nodes and/or tree depth.
6. The method of any preceding embodiment, further comprising manipulating the first and/or second data by an expert operator to account for a source of variation which is not included in the first data.
7. The method of any preceding embodiment, further comprising pre-processing the first data to apply a transformation or projection, prior to applying the partition rules.
8. The method of any preceding embodiment, further comprising merging two or more subsets of the first data.
9. A method of partitioning substrates based on data associated with substrates before being subject to a process step, the method comprising:
    partitioning the data using a partition rule as selected by a method according to any preceding embodiment; and
    partitioning the substrates into subsets, wherein each subset is associated with a subset of the data obtained by the partitioning.
10. The method of embodiment 9, further comprising determining a process control characteristic associated with a subset of the substrates.
11. The method of embodiment 10, further comprising performing the process step on each substrate based on the process control characteristic determined for the subset to which that substrate belongs.
12. The method of any preceding embodiment, wherein the first data comprises parameters and values associated with the parameters, relating to one or more selected from:
    a property of an alignment mark;
    a height map of a substrate;
    a property of a surface of a substrate;
    a setting of a tool utilized for processing substrates before the process step;
    identification of a tool utilized for processing substrates before the process step; and/or
    a characteristic of a tool utilized for processing substrates before the process step.
13. The method of any preceding embodiment, wherein the second data comprises parameters and values associated with the parameters, relating to one or more selected from:
    a property of an alignment mark;
    a height map of a substrate;
    a property of a surface of a substrate;
    performance data associated with a feature provided to substrates, the performance data relating to one or more selected from: overlay between layers, overlay between patterns applied by multiple patterning steps in a single layer, focus quality, CD of the feature, edge placement error of the feature, an electrical characteristic of the feature, and/or yield of substrates relating to a relative amount of functioning devices comprising the feature.
14. The method of embodiment 12 or embodiment 13, wherein the partition rule includes at least one decision operation configured to divide the first data based on a value of a parameter comprised within the first data.
15. The method of any of embodiments 11 to 13, wherein the partition rule defines a decision tree comprising a succession of decision steps.

CONCLUSION

In conclusion, the present disclosure proposes a method for grouping data associated with substrates undergoing a process step of a manufacturing process based on the adjacency or distance between a plurality of sets of second data (context data) associated with substrates, each set of second data being associated with a different value of a characteristic of the first data.

When used as part of a processing step in a decision tree algorithm, because the grouping is implicit in the decision tree, such that intra-group variation is, e.g., minimized, no explicit notion of fingerprint clusters needs to be established. This allows the method to be applied with a relatively small number of product units, compared to the number of variations in the post-processing parameters (dimensionality of "fingerprint space") and the dimensionality of the context space (pre-processing data parameters).

The ability to perform cross-validation and to split the parameter space per context variable promote good generalization of the method in practice. The method can also be more scalable to high-volume manufacture than known methods. A mixture of categorical and continuous-valued context variables can be included.

The number of groups does not grow exponentially with the dimensionality of the individual context variables. This is in contrast to prior approaches, where, for example, a separate feedback loop ("control thread") might be established for each context value such as etch chamber ID. The decision tree classifier will only single out those combinations of chambers and tools that lead to significant fingerprint variation. Irrelevant context will automatically be ignored.

Instead of binary decision tree algorithms, other methods may be used as well. Significant here is that the algorithm generates a plurality of partition rules, each partition rule defining a different partitioning of substrates, based on their pre-processing data. The plurality of partition rules may for example be generated randomly. Selection of an (adequate or even optimal) partition rule is based on evaluating a characteristic of post-processing data associated with a subset of pre-processing data as obtained by application of the partition rule of interest. For example, a large amount of partition rules may be based on varying the parameter used to divide the substrates into subsets based on the pre-processing data. For example, a first partition rule may divide the substrates based on a utilized etch chamber and a second partition rule may be based on a temperature associated with a performed deposition process. In such a case, the second partition rule may be based on a value of a parameter comprised within the pre-processing data, for example a first partition rule selects pre-processing data associated with a first temperature range and a second partition rule selects pre-processing data associated with a second temperature range.

Subsequent to definition of the subsets of the substrates based on the pre-processing data, a characteristic of the post-processing data associated with at least one subset of substrates is determined. For example, overlay data associated with substrates having passed a certain etch chamber and having been subject to a deposition process at a certain temperature range is isolated from the full set of post-processing (in this case overlay) data. A characteristic of the overlay data associated with that particular set is determined. Such a characteristic may be related to a measure of variability of the post-processing data across the particular set, such as a variance (of overlay). One or more other characteristics may be considered: predicted yield or any other cost function mapping the post-processing data to a scalar being representative for a desired property of the particular set of substrates. In the case of the characteristic being a variance of overlay data, the partition rule may be selected based on an observed minimum of the variability characteristic, meaning that substrates associated with a subset of pre-processing data as carved out by the partition rule all share a similar overlay characteristic.

The pre-processing data may comprise parameters and values associated with the parameters relating to one or more selected from: one or more properties of one or more alignment marks; one or more height maps of one or more substrates; one or more properties of a surface of one or more substrates; one or more settings of one or more tools utilized for processing the substrates before the process step; identification of one or more tools utilized for processing the substrates before the process step; and/or one or more characteristics of one or more tools utilized for processing the substrates before the process step. In general, before performing a process step of interest, data associated with previous layers and previous process steps is known (at least when a process of monitoring this data is in place). In case of a lithographic process, data associated with pre-exposure metrology steps such as alignment and leveling of the substrate may be available and hence be comprised within the pre-processing data.

In the terminology of the PCT patent application publication no. WO 2017/060080, the pre-processing data based on measurement of the actual substrates may be referred to as "object data". In this case, the "object data" available in advance of the exposure may be regarded in the same way as other types of pre-processing data, referred to as "context data". The post-processing data corresponds to "performance data" in PCT patent application publication no. WO 2017/060080, as it relates to the results actually achieved by the lithographic processing step, in the context of each substrate.

The post-processing data may comprise parameters and values associated with the parameters relating to one or more selected from: one or more properties of one or more alignment marks; one or more height maps of one or more substrates; one or more properties of a surface of one or more substrates; and/or performance data associated with one or more features provided to the substrates during the process step and/or after the process step. Such performance data may, for example, relate to one or more selected from: overlay between layers, overlay between patterns applied by multiple patterning steps in a single layer, focus quality, CD of the one or more features, edge placement error of the one or more features, one or more electrical characteristics of the one or more features, and/or yield of the substrates relating to a relative amount of functioning devices comprising the one or more features.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc. In that regard, the processed "substrates" may be semiconductor wafers, or they may be other substrates, according to the type of product being manufactured.

Although specific reference may be made in this text to embodiments of the invention in the context of a lithographic apparatus, embodiments of the invention may be used in other apparatus. Embodiments of the invention may form part of a patterning device inspection apparatus, a metrology apparatus, or any apparatus that measures or processes an object such as a wafer (or other substrate) or a mask (or other patterning device). These apparatuses may be generally referred to as lithographic tools. Such a lithographic tool may use vacuum conditions or ambient (non-vacuum) conditions.

In the present document, the terms "radiation" and "beam" are used to encompass all types of radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Although specific reference may have been made above to the use of embodiments of the invention in the context of optical lithography, it will be appreciated that the invention, where the context allows, is not limited to optical lithography and may be used in other applications, for example imprint lithography.

The terms "optimizing" and "optimization" as used herein refers to or means adjusting an apparatus (e.g., a lithography apparatus), a process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

Further embodiments of the invention are disclosed in the list of numbered embodiments below:

1. A method for grouping data associated with substrates undergoing a process step of a manufacturing process, the method comprising:

obtaining first data associated with substrates before being subject to the process step;

obtaining a plurality of sets of second data associated with substrates after being subject to the process step, each set of second data being associated with a different value of a characteristic of the first data;

determining a distance metric describing a measure of distance between the sets of second data; and grouping the second data based on a property of the distance metric.

2. A method according to embodiment 1, comprising determining a representative post-processing data metric for each set of second data, and determining the distance metric to describe a measure of distance between the representative post-processing data metric.

3. A method according to embodiment 2, wherein said representative post-processing data metric comprises an aggregate for values of said second data in each set of second data.

4. A method according to embodiment 3, wherein the distance metric is a distance matrix describing a measure of the distance between respective pairs of said representative post-processing data metrics.

5. A method according to embodiment 4, wherein, prior to said grouping step, the distance matrix is transformed into an adjacency matrix describing a measure of the adjacency between respective pairs of said representative post-processing data metrics.

6. A method according to any preceding embodiment comprising determining a fully connected graph from said distance metric.

7. A method according to embodiment 6, comprising determining a respective spectral code for each set of second data based on said fully connected graph, and grouping said second data based on said spectral code.

8. A method according to embodiment 7, wherein said spectral code is determined from the eigenvectors of a matrix representation of said fully connected graph.

9. A method according to embodiment 8, wherein said matrix representation of said fully connected graph comprises a Laplacian matrix.

10. A method according to embodiment 8 or 9, wherein said spectral code is determined from a subset of the eigenvectors.

11. A method according to embodiment 10, wherein determining said spectral code comprises ranking said eigenvectors according to their associated eigenvalues and selecting said subset based on their ranking.

12. A method according to embodiment 11, wherein said grouping comprises performing a clustering step based on said spectral code.

13. The method according to any preceding embodiment, wherein the first data is usage data associated with one or more apparatuses used in the manufacturing process.

14. A method according to embodiment 13, wherein the characteristic is associated with an identification of the one or more apparatuses.

15. A method according to any preceding embodiment, wherein the second data is one or more selected from: alignment, leveling, CD, overlay, voltage contrast, electrical characteristics, EPE, and/or focus data associated with a substrate subject to the manufacturing process.

16. A method according to any preceding embodiment, wherein the distance metric is Euclidean or cosine based.

17. A method according to any preceding embodiment, further comprising partitioning the grouped second data using a decision tree algorithm applied to the grouped second data.

18. A method according to embodiment 17, wherein said partitioning comprises applying a plurality of partition rules to the first data to obtain a plurality of configurations of subsets of the first data; and selecting a partition rule based on a characteristic of subsets of the second data that are associated with the subsets of the first data obtained by applying the partition rule to the first data.

19. A method according to embodiment 18, wherein a decision tree training algorithm is utilized to perform the steps of applying the plurality of partition rules and selecting the partition rule.

20. A method according to embodiment 19, wherein the training algorithm is a recursive binary decision tree algorithm utilized to perform the steps of applying the plurality of partition rules and selecting the partition rule.

21. A computer program comprising program instructions operable to perform the method of any of claims 1 to 19, when run on a suitable apparatus.

22. A non-transient computer program carrier comprising the computer program of claim 20.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for grouping data associated with substrates undergoing a process step of a manufacturing process, the method comprising:
    obtaining first data associated with substrates before being subject to the process step;
    obtaining a plurality of sets of second data associated with substrates after being subject to the process step, each set of second data being associated with a different value of a characteristic of the first data;
    determining, by a hardware computer system, a distance metric describing a measure of distance between the sets of second data; and
    grouping the second data based on a property of the distance metric.

2. The method as claimed in claim 1, comprising determining a representative post-processing data metric for each set of second data, and determining the distance metric to describe a measure of distance between the representative post-processing data metrics of the sets of second data.

3. The method as claimed in claim 2, wherein the representative post-processing data metric comprises an aggregate for values of the second data in a respective set of second data.

4. The method as claimed in claim 3, wherein the distance metric is a distance matrix describing a measure of the distance between respective pairs of the representative post-processing data metrics.

5. The method as claimed in claim 4, wherein, prior to the grouping, the distance matrix is transformed into an adjacency matrix describing a measure of adjacency between respective pairs of the representative post-processing data metrics.

6. The method as claimed in claim 1, further comprising determining a fully connected graph from the distance metric.

7. The method as claimed in claim 6, comprising determining a respective spectral code for each set of second data based on the fully connected graph, and grouping the second data based on the spectral code.

8. The method as claimed in claim 7, wherein the spectral code is determined from one or more eigenvectors of a matrix representation of the fully connected graph.

9. The method as claimed in claim 8, wherein the matrix representation of the fully connected graph comprises a Laplacian matrix.

10. The method as claimed in claim 8, wherein the spectral code is determined from a plurality of eigenvectors of the matrix representation of the fully connected graph.

11. The method as claimed in claim 10, wherein determining the spectral code comprises ranking eigenvectors of the matrix representation of the fully connected graph according to their associated eigenvalues and selecting a subset of the eigenvectors, based on their ranking, for use in the determining of the spectral code.

12. The method as claimed in claim 7, wherein the grouping comprises performing a clustering step based on the spectral code.

13. The method as claimed in claim 1, wherein the first data is usage data associated with one or more apparatuses used in the manufacturing process.

14. The method as claimed in claim 13, wherein the characteristic is associated with an identification of the one or more apparatuses.

15. The method as claimed in claim 1, wherein the distance metric is Euclidean or cosine based.

16. The method according to claim 1, further comprising partitioning the grouped second data using a decision tree algorithm applied to the grouped second data.

17. The method according to claim 16, wherein the partitioning comprises applying a plurality of partition rules to the first data to obtain a plurality of configurations of subsets of the first data; and
    selecting a partition rule based on a characteristic of subsets of the second data that are associated with the subsets of the first data obtained by applying the selected partition rule to the first data.

18. The method according to claim 17, wherein a decision tree training algorithm is utilized to perform the steps of applying the plurality of partition rules and selecting the partition rule.

19. A non-transient computer program carrier comprising a computer program therein, the computer program, upon execution by a computer system, configured to cause the computer system to at least:
    obtain first data associated with substrates before the substrates are subject to a process step of a manufacturing process;
    obtain a plurality of sets of second data associated with substrates after being subject to the process step, each set of second data being associated with a different value of a characteristic of the first data;
    determine a distance metric describing a measure of distance between the sets of second data; and
    group the second data based on a property of the distance metric.

20. The computer program carrier of claim 19, wherein the instructions are further configured to cause the computer system to determine a representative post-processing data metric for each set of second data, and determine the distance metric to describe a measure of distance between the representative post-processing data metrics of the sets of second data.

* * * * *